United States Patent
Jian

(10) Patent No.: US 10,304,557 B2
(45) Date of Patent: May 28, 2019

(54) METHODS FOR OPERATING A DATA STORAGE DEVICE AND DATA STORAGE DEVICE UTILIZING THE SAME

(71) Applicant: Silicon Motion, Inc., Jhubei, Hsinchu (TW)

(72) Inventor: Wen-Chun Jian, Zhubei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 116 days.

(21) Appl. No.: 15/606,164

(22) Filed: May 26, 2017

(65) Prior Publication Data
US 2017/0365359 A1    Dec. 21, 2017

(30) Foreign Application Priority Data
Jun. 15, 2016    (TW) .............................. 105118709 A

(51) Int. Cl.
*G06F 3/06*    (2006.01)
*G11C 29/48*    (2006.01)
*G11C 16/20*    (2006.01)

(52) U.S. Cl.
CPC ............ *G11C 29/48* (2013.01); *G06F 3/0604* (2013.01); *G06F 3/0632* (2013.01); *G06F 3/0647* (2013.01); *G06F 3/0659* (2013.01); *G06F 3/0685* (2013.01); *G11C 16/20* (2013.01)

(58) Field of Classification Search
CPC .. G06F 11/1417; G06F 3/0604; G06F 3/0679; G06F 3/0659; G06F 9/4408; G06F 9/4403
See application file for complete search history.

(56) References Cited

U.S. PATENT DOCUMENTS

| | | | | |
|---|---|---|---|---|
| 8,316,200 B2 * | 11/2012 | Matsuoka | ........... | G06F 12/1433 711/163 |
| 9,490,022 B2 * | 11/2016 | Lin | ........................ | G11C 16/20 |
| 2003/0056071 A1 * | 3/2003 | Triece | .................... | G06F 9/4401 711/165 |
| 2007/0011507 A1 * | 1/2007 | Rothman | ............ | G06F 11/2736 714/718 |
| 2017/0024303 A1 * | 1/2017 | Christopher | .......... | G06F 11/366 |

* cited by examiner

*Primary Examiner* — Nadeem Iqbal
(74) *Attorney, Agent, or Firm* — McClure, Qualey & Rodack, LLP

(57) ABSTRACT

A data storage device includes a flash memory and a controller. The controller is coupled to the flash memory and includes a ROM which stores a boot code. In an initialization procedure of the data storage device, the controller does not access the flash memory and receives a debug code from an external device, and executes the boot code and the debug code to complete the initialization procedure.

8 Claims, 2 Drawing Sheets

METHODS FOR OPERATING A DATA STORAGE DEVICE AND DATA STORAGE DEVICE UTILIZING THE SAME

CROSS REFERENCE TO RELATED APPLICATIONS

This Application claims priority of Taiwan Patent Application No. 105118709, filed on Jun. 15, 2016, the entirety of which is incorporated by reference herein.

BACKGROUND OF THE INVENTION

Field of the Invention

The invention relates to a data storage device comprising a flash memory, and more particularly to a data storage device and operating methods for a data storage device capable of preventing sampling data from being damaged.

Description of the Related Art

The technology behind data storage devices has developed rapidly in recent years, and many handheld data storage devices, such as memory cards compliant with SD/MMC standards, CF standards, MS standards and XD standards, solid-state hard drives, built-in memory (embedded Multi Media Card, or eMMC) and universal flash memory (universal flash Storage, or UFS), have been widely applied in a variety of applications. Therefore, the effective control of access to these data storage devices has become an important issue.

Typically, a data storage device stores error sampling data returned by the host device. The error sampling data records error information, such as access failure when the host device tries to access the data storage device or an unrecognized data storage device, or others. The error sampling data is helpful when analyzing the causes of operational errors. However, the error sampling data may be damaged when accessing the data storage device. Therefore, operation methods of a data storage device are provided that prevent the data stored in the data storage device from being damaged, which prevents damage to the error sampling data and other important data.

BRIEF SUMMARY OF THE INVENTION

A data storage device and a method for operating a data storage device are provided. An exemplary embodiment of a data storage device comprises a flash memory and a controller. The controller is coupled to the flash memory and includes a ROM which stores a boot code. In an initialization procedure of the data storage device, the controller does not access the flash memory and receives a debug code from an external device, and executes the boot code and the debug code to complete the initialization procedure.

An exemplary embodiment of a method for operating a data storage device comprising a flash memory and a controller comprises: forbidding the controller to access the flash memory in an initialization procedure of the data storage device; loading a debug code from an external device by the controller; and executing a boot code and the debug code by the controller to complete the initialization procedure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
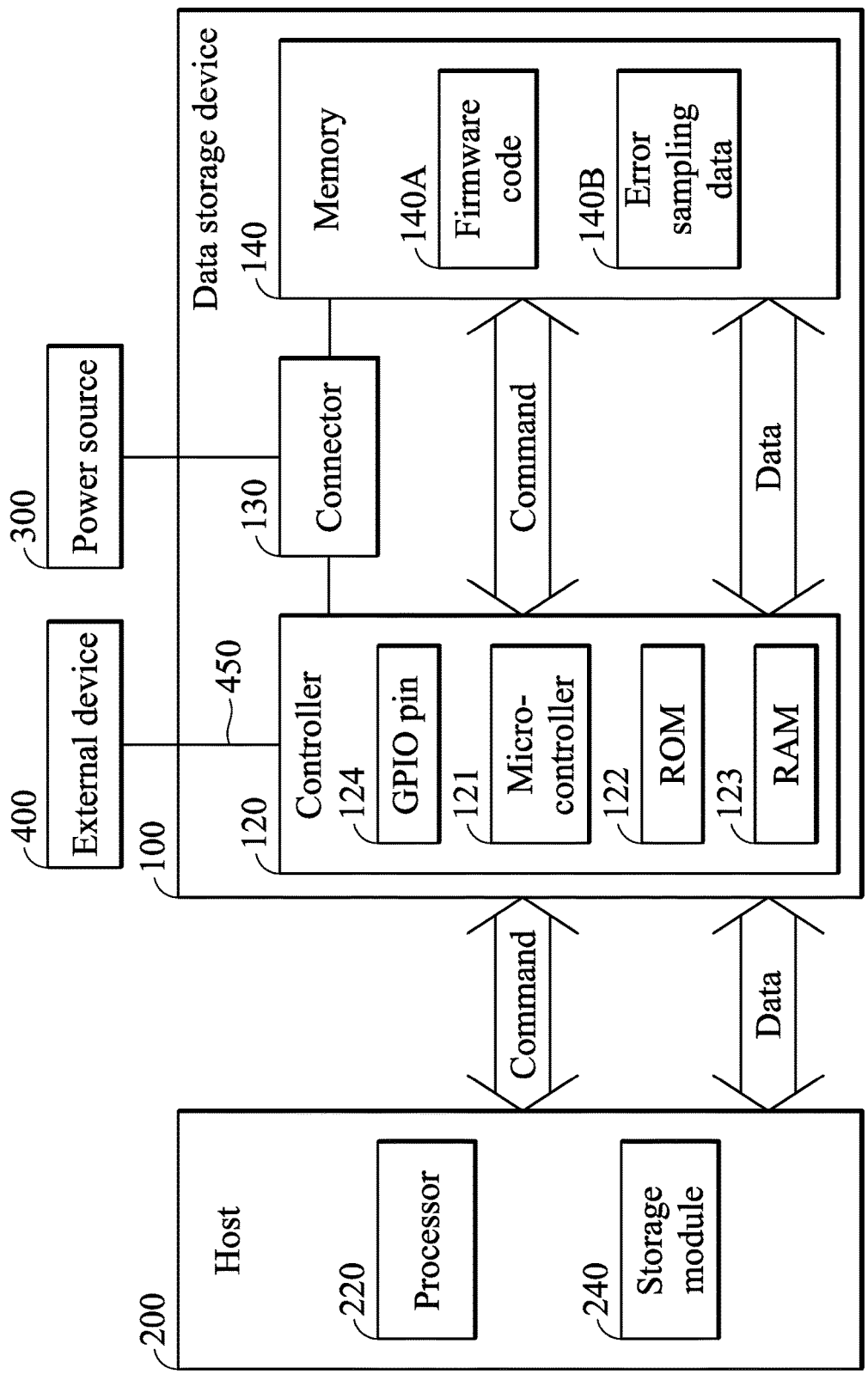
FIG. 1 is a schematic diagram of a data storage device 100 and a host 200 according to an embodiment of the invention.

FIG. 1 is a schematic diagram of a data storage device 100 and a host 200 according to an embodiment of the invention. In one embodiment, the data storage device 100 comprises a controller 120 and a memory 140. The data storage device 100 is coupled to the host 200 to transmit data and instructions or receive data and instructions. The memory 140 may be a non-volatile memory device such as NAND flash. The host 200 may be a mobile phone, a tablet computer, a laptop computer, a navigation device or in-vehicle system. As shown in FIG. 1, the host 200 comprises a processor 220 and a storage module 240. For example, the storage module 240 is utilized to record data which has been accessed (being written and read) by the host 200. The processor 220 issues commands to access the data storage device 100 according to requirements.

As shown in FIG. 1, the memory 140 comprises a plurality of blocks for storing data. For example, the memory 140 may store the firmware code 140A of the data storage device 100 and the error sampling data 140B of the data storage device 100. The error sampling data 140B records error information of the data storage device 100, such as access failure when the host 200 tries to access the data storage device 100 or the data storage device 100 is unrecognizable by other devices, or others. The error sampling data 140B is helpful in analyzing the root causes of operation failures or errors.

The controller 120 is coupled to the memory 140 for transmitting data and commands to the memory 140 and/or receiving data and commands from the memory 140. To be more specific, the controller 120 may comprise a microcontroller 121, a read-only-memory (ROM) 122 and a random access memory (RAM) 123. The micro-controller 121 may execute the firmware code to operate or access the memory 140. The ROM 122 may store the boot code of the data storage device 100. The micro-controller 121 may execute the boot code when the data storage device 100 powers up, so as to begin the initialization procedure of the data storage device 100.

Generally, when the data storage device 100 powers up, the micro-controller 121 executes the boot code first to perform a simple initialization procedure, and then accesses the firmware code 140A stored in the memory 140 and loads the firmware code 140A into the RAM 123. The micro-controller 121 completes the overall initialization procedure of the whole system of the data storage device 100 by executing the boot code and the firmware code 140A. During the initialization procedure of the data storage device 100, the micro-controller 121 sets the corresponding configurations of the data storage device 100 and the memory 140, so that the host 200 can recognize the data storage device 100 and access the data stored in the data storage device 100 after the completion of the initialization procedure.

However, during the initialization procedure of the data storage device 100, the content of the error sampling data 140B may be damaged due to the access of the memory 140 by the micro-controller 121.

To solve the above-mentioned problem, according to an embodiment of the invention, when there is some error sampling data 140B to be analyzed, the micro-controller 121 of the controller 120 does not access the memory 140 in the initialization procedure of the data storage device 100. To be more specific, in the initialization procedure of the data storage device 100, the micro-controller 121 of the controller 120 does not load the firmware code 140A from the memory 140, and loads a debug code from an external device 400 via an interface 450 instead. The micro-controller 121 of the controller 120 completes the overall initialization procedure of the whole system of the data storage device 100 by executing the boot code and the debug code.

According to an embodiment of the invention, the debug code may comprise the program codes regarding the system initialization and the error sampling data analysis. Therefore, the micro-controller 121 can also set the corresponding configurations of the data storage device 100 and the memory 140 during the initialization procedure of the data storage device 100 by executing the boot code and the debug code, so that the host 200 can recognize the data storage device 100 and be able to access the data stored in the data storage device 100 after the completion of the initialization procedure.

According to an embodiment of the invention, the data storage device 100 may comprise a connector 130, such as a jumper, for controlling whether a voltage source provides a voltage to the memory 140 or not. In the embodiment of the invention, the voltage source may be obtained from an external power source 300 or from the controller 120. At the beginning of the initialization procedure, the connector 130 controls the voltage source not to provide the voltage to the memory 140. For example, the connector 130 may control the voltage source not connect to the memory 140, or control a path between the memory 140 and the voltage source being disconnected. In a preferred embodiment of the invention, the path between the memory 140 and the voltage source may be disconnected before the data storage device 100 powers up or right after the data storage device 100 powers up, so as to prevent it from accessing the memory 140 during the process of the controller 120 executing the boot code.

As the memory 140 is disconnected from the voltage source, the controller 120 cannot access the memory 140 and loads the debug code from the external device 400 via the interface 450 instead. According to an embodiment of the invention, the host 200 may issue commands to the controller 120, so as to control the controller 120 to perform an initialization setting of the external device 400 and communicate with the external device 400, so that the controller 120 can load the debug code from the external device 400.

After the micro-controller 121 of the controller 120 loads the debug code, the connector 130 may further control the voltage source to provide the voltage to the memory 140, so as to perform the initialization procedure of the data storage device 100. For example, the connector 130 may control the voltage source being connected to the memory 140 or make the path between the memory 140 and the voltage source a short circuit. The micro-controller 121 of the controller 120 completes the overall initialization procedure of the whole system of the data storage device 100 by executing the boot code and the debug code, and may analyze the error sampling data 140B further.

According to another embodiment of the invention, via the firmware setting, the micro-controller 121 of the controller 120 is forbidden (that is, not allowed) from accessing the memory 140 in the initialization procedure of the data storage device 100. To be more specific, the host 200 may issue a command to set the voltage at the GPIO pin 124. For example, when the voltage at the GPIO pin 124 is set to a high voltage level (that is, value 1), it means that the controller 120 is allowed to access the memory 140. When the voltage at the GPIO pin 124 is set to a low voltage level (that is, value 0), it means that the controller 120 is not allowed to access the memory 140.

At the beginning of the initialization procedure, by executing the corresponding firmware, the controller 120 may determine whether accessing the memory 140 is allowed or not according to the voltage at the GPIO pin 124. When the controller 120 is not allowed to access the memory 140, the controller 120 may load the debug code from the external device 400 as discussed above.

After the micro-controller 121 of the controller 120 loads the debug code, the host 200 may further issue a command to set the voltage at the GPIO pin 124, so as to allow the micro-controller 121 of the controller 120 to access the memory 140 for performing the initialization procedure on the data storage device 100.

According to another embodiment of the invention, via the firmware setting, the micro-controller 121 of the controller 120 is forbidden (that is, not allowed) from accessing the error sampling data 140B stored in the memory 140 in the initialization procedure of the data storage device 100, so as to prevent the content of the error sampling data 140B from being damaged. For example, when the voltage at the GPIO pin 124 is set to a high voltage level (that is, the value 1), it means that the controller 120 is allowed to access the error sampling data 140B stored in the memory 140. When the voltage at the GPIO pin 124 is set to a low voltage level (that is, the value 0), it means that the controller 120 is not allowed to access the error sampling data 140B stored in the memory 140.

By executing the corresponding firmware at the beginning of the initialization procedure, the controller 120 may determine whether accessing the memory 140 is allowed or not according to the voltage level at the GPIO pin 124, so as to prevent the content of the error sampling data 140B from being damaged.

In the embodiment of the invention, the micro-controller 121 of the controller 120 may access the firmware code 140A stored in the memory 140 and complete the overall initialization procedure of the whole system of the data storage device 100 by executing the boot code and the firmware code 140A, or may also load the debug code from the external device 400 from the external device 400 as discussed above and complete the overall initialization procedure of the whole system of the data storage device 100 by executing the boot code and the debug code.

After the micro-controller 121 of the controller 120 loads the debug code or after the initialization procedure is completed, the host 200 may further issue a command to set the voltage at the GPIO pin 124, so as to allow the micro-controller 121 of the controller 120 to access the error sampling data 140B stored in the memory 140 for performing the initialization procedure of the data storage device 100 or further analyzing the error sampling data 140B.

Figure 2:
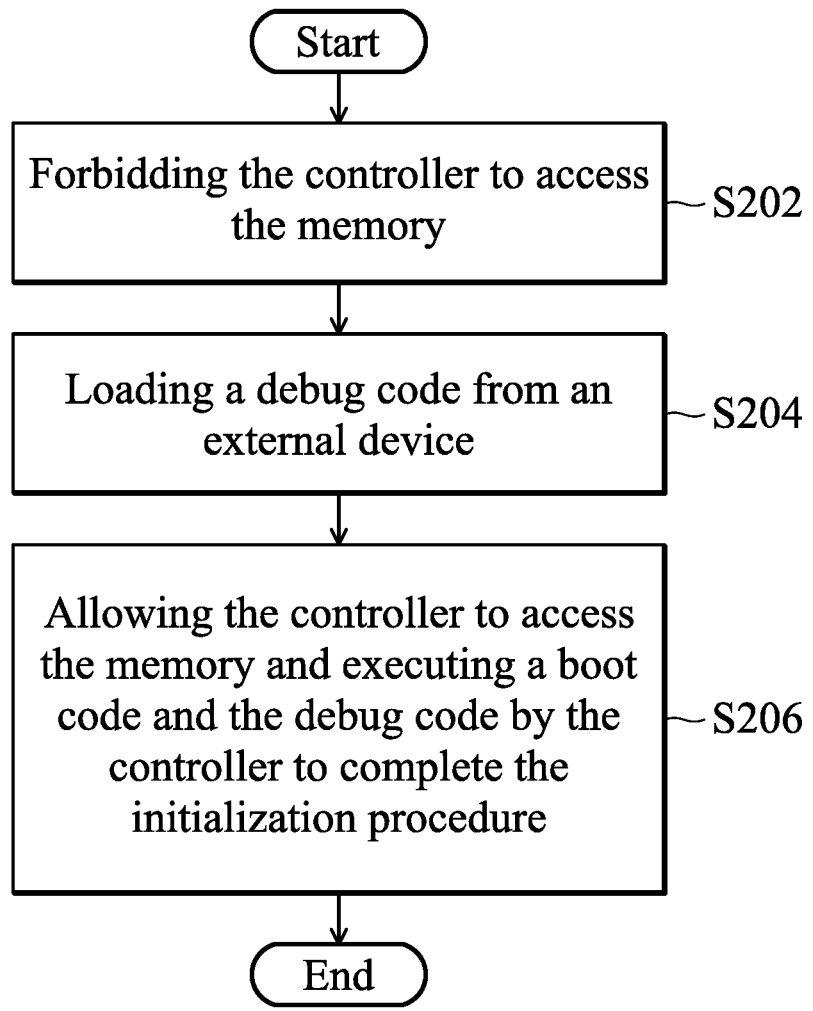
FIG. 2 shows a flow chart of a method for operating a data storage device according to an embodiment of the invention.

FIG. 2 shows a flow chart of a method for operating a data storage device according to an embodiment of the invention. First of all, in the initialization procedure of the data storage device 100, the controller 120 is forbidden to access the memory 140 (Step S202). In the embodiment of the invention, the controller 120 may be forbidden to access the memory 140 or the error sampling data 140B stored in the memory 140 via the firmware setting, or the voltage sources may not provide voltage to the memory 140 under the control of the connector 130, so that the controller 120 is temporarily unable to access the memory 140 at the beginning of the initialization procedure of the data storage device 100. Next, the controller loads a debug code from an external device (Step S204). Next, the controller 120 is allowed to access the memory 140 and execute a boot code and the debug code to complete the initialization procedure (Step S206). In the embodiments of the invention, as discussed above, the controller 120 may be allowed to access the memory 140 via the firmware setting, or the voltage source may provide voltage to the memory 140 via the connector 130 so as to allow the controller 120 to access the memory 140 after loading the debug code, and allow the controller to access the error sampling data 140B stored in the memory 140, for subsequently analyzing the error sampling data.

In summary, by preventing the controller 120 from accessing the memory 140 or the error sampling data 140B stored in the memory 140 in the initialization procedure via the control method illustrated above, damage to the error sampling data 140B can be avoided during the initialization procedure.

The term "coupled" in the specification generally refers to any types of direct or indirect electrical connections. While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
   a flash memory;
   a controller, coupled to the flash memory and comprising a read only memory (ROM), wherein a boot code is stored in the ROM; and
   a connector, controlling a voltage source to provide a voltage to the flash memory or not to provide the voltage to the flash memory, and
   wherein in an initialization procedure of the data storage device, the controller does not access the flash memory and loads a debug code from an external device instead, and the controller executes the boot code and the debug code to complete the initialization procedure, and
   wherein at the beginning of the initialization procedure, the connector controls the voltage source not to provide the voltage to the flash memory.

2. The data storage device as claimed in claim 1, wherein after the controller loads the debug code, the connector controls the voltage source to provide the voltage to the flash memory.

3. The data storage device as claimed in claim 1, wherein the flash memory stores error sampling data of the data storage device, and in the initialization procedure, the controller does not access the error sampling data stored in the flash memory.

4. The data storage device as claimed in claim 1, wherein after the controller loads the debug code, the controller accesses the flash memory.

5. A method for operating a data storage device, wherein the data storage device comprises a flash memory and a controller, comprising:
   forbidding the controller to access the flash memory in an initialization procedure of the data storage device by controlling a voltage source not to provide a voltage to the flash memory at the beginning of the initialization procedure;
   loading a debug code from an external device by the controller; and
   executing a boot code and the debug code by the controller to complete the initialization procedure.

6. The method for operating the data storage device as claimed in claim 5, further comprising:
   controlling the voltage source to provide the voltage to the flash memory after loading the debug code.

7. The method for operating the data storage device as claimed in claim 5, further comprising:
   forbidding the controller to access error sampling data stored in the flash memory in the initialization procedure of the data storage device.

8. The method for operating the data storage device as claimed in claim 7, further comprising:
   allowing the controller to access the error sampling data stored in the flash memory after loading the debug code.

* * * * *